(12) United States Patent
Gauthier, Jr. et al.

(10) Patent No.: US 7,547,917 B2
(45) Date of Patent: Jun. 16, 2009

(54) INVERTED MULTILAYER SEMICONDUCTOR DEVICE ASSEMBLY

(75) Inventors: Robert J. Gauthier, Jr., Hinesburg, VT (US); Mahmoud A. Mousa, South Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 10/907,566

(22) Filed: Apr. 6, 2005

(65) Prior Publication Data

US 2006/0226491 A1 Oct. 12, 2006

(51) Int. Cl.
*H01L 29/12* (2006.01)
(52) U.S. Cl. .................... 257/67; 257/69; 257/347; 257/350; 257/E29.068
(58) Field of Classification Search ................ 257/777, 257/685, 686, 67, 69, 347, 350; 438/455
See application file for complete search history.

(56) References Cited

U.S. PATENT DOCUMENTS

| | | | |
|---|---|---|---|
| 4,612,083 A * | 9/1986 | Yasumoto et al. | 438/59 |
| 5,057,898 A | 10/1991 | Adan et al. | |
| 5,426,072 A | 6/1995 | Finnila | |
| 5,889,302 A | 3/1999 | Liu | |
| 6,075,268 A * | 6/2000 | Gardner et al. | 257/327 |
| 6,124,615 A | 9/2000 | Lee | |
| 6,355,501 B1 | 3/2002 | Fung et al. | |
| 6,590,258 B2 | 7/2003 | Divakauni et al. | |
| 6,670,677 B2 | 12/2003 | Choe et al. | |
| 6,815,278 B1 | 11/2004 | Ieong et al. | |
| 7,125,785 B2 | 10/2006 | Cohen et al. | |
| 2003/0094674 A1 | 5/2003 | Ipposhi et al. | |
| 2004/0144979 A1 | 7/2004 | Bhattacharyya | |
| 2004/0146701 A1 | 7/2004 | Taguchi | |
| 2005/0045995 A1 | 3/2005 | Ieong et al. | |
| 2005/0116290 A1 | 6/2005 | de Souza et al. | |
| 2005/0277260 A1 | 12/2005 | Cohen et al. | |
| 2006/0003554 A1 | 1/2006 | Zhu et al. | |
| 2006/0049460 A1 * | 3/2006 | Chen et al. | 257/347 |
| 2006/0237790 A1 | 10/2006 | Zhu et al. | |
| 2007/0015346 A1 | 1/2007 | Cohen et al. | |

OTHER PUBLICATIONS

S. J. Abou-Samra et al., "3D CMOS SOI for High Performance Computing", International Symposium on Low Power Electronics and Design, 1998 Proceedings, Aug. 10-12, 1998.

IBM Technical Disclosure Bulletin, "Stacked Technology for Random-Access Memory Construction", vol. 29, No. 8, Jan. 1987, pp. 3428-3429.

* cited by examiner

*Primary Examiner*—Thanh Nguyen
(74) *Attorney, Agent, or Firm*—Richard Kotulak; Greenblum & Bernstein P.L.C.

(57) ABSTRACT

An apparatus and method for an inverted multilayer silicon over insulator (SOI) device is provided. In the multilayer SOI device, the crystal orientation of at least one active region of a device may be different than the active region of at least another device. Where the multilayer SOI device has a first layer including a PMOS device with a silicon active region having a crystal orientation of [100], the second layer may be an NMOS device with an active region having a silicon layer having a crystal orientation of [110]. The second layer is bonded to the first layer. The method and apparatus can be extended to more than two layers thus forming a multilayer SOI device having a different crystal orientation at each layer. The multiple layer SOI device may form circuits of reduced surface area.

9 Claims, 3 Drawing Sheets

INVERTED MULTILAYER SEMICONDUCTOR DEVICE ASSEMBLY

FIELD OF THE INVENTION

The invention relates to stacked circuits, and more particularly to a stacked circuit having an inverted device and to a stacked circuit having an inverted device with a different crystal orientation.

BACKGROUND DESCRIPTION

SOI (Silicon On Insulator) technology reduces or eliminates bulk CMOS latch-up problems. Additionally, SOI technology reduces junction capacitance and allows circuits to operate at higher speeds. Accordingly, SOI technology allows a higher circuit density to be achieved on a silicon wafer.

A multiple layer device structure can be created using SOI technology. Each level of a multilevel structure created using SOI may be interconnected using vertical plugs. Metal connections can be used at any level. In a multilevel device, NMOS and PMOS devices may each be restricted to a separate level, or NMOS and PMOS devices may be intermixed on a single level. However, having multiple levels where each level requires a set of separate metal connections may result in a large number of metal connections, increasing the complexity and costs of the chip. Furthermore, a layer of a multilevel device may inhibit cooling of adjacent layers by limiting heat transfer therefrom.

For some types of semiconductor devices, it is advantageous to have multiple layers of similar semiconductor material, where each layer has a crystal orientation different from the adjoining layers. When multi-layer devices are formed from a common semiconductor layer they will have the same crystal orientation from one level to the next. This limitation on the crystal orientation across multiple levels of an integrated circuit results from constraints imposed by the fabrication process.

In particular, semiconductor material is traditionally grown from a pre-existing layer of semiconductor material. During the material growth process, the atoms of the newly formed layer have a strong tendency to orient themselves to the pre-existing substrate's crystal structure as they are laid down. Thus, it becomes very difficult to create a new layer of similar semiconductor material having a crystal orientation which is different from the underlying layer.

SUMMARY OF THE INVENTION

In a first aspect of the invention, a method of forming a semiconductor device assembly includes forming a first semiconductor device having a first crystal region and a second semiconductor device having a second crystal region. The first semiconductor device is placed in contact with the second semiconductor device.

In another aspect of the invention, the method includes forming a first semiconductor device having a first crystal orientation in a substrate and forming a second semiconductor device having a second crystal orientation in a substrate. The first semiconductor device is placed in contact with the second semiconductor device.

In yet another aspect of the invention, the semiconductor device assembly includes an NMOS device having a first crystal orientation and a PMOS device having a second crystal orientation inverted on a surface of the NMOS device.

DETAILED DESCRIPTION OF EMBODIMENTS OF THE INVENTION

In embodiments of the invention, a first CMOS device, such as a pFET, is formed having a first crystal orientation in the active region of the device, and a second CMOS device, such as an nFET, is formed having a second crystal orientation in the active region of the second device. After both devices are formed, the second device is flipped over and bonded to the first device with a bonding layer such as $SiO_2$ forming an inverted stacked or an inverted multi-layered arrangement. At lease one of the contacts of the first device is aligned with the corresponding contact of the second device, and the two contacts are brought into electrical contact with one another during bonding. Because the two devices are bonded in an inverted stacked arrangement, the devices are easily interconnected along the boundary between the two devices. Thus, it is possible to form stacked layers of CMOS devices where each layer has either the same or a different crystal orientation in the active region as a layer below it and/or a layer above it, and the combination of devices has a reduced number of connections.

Figure 1:
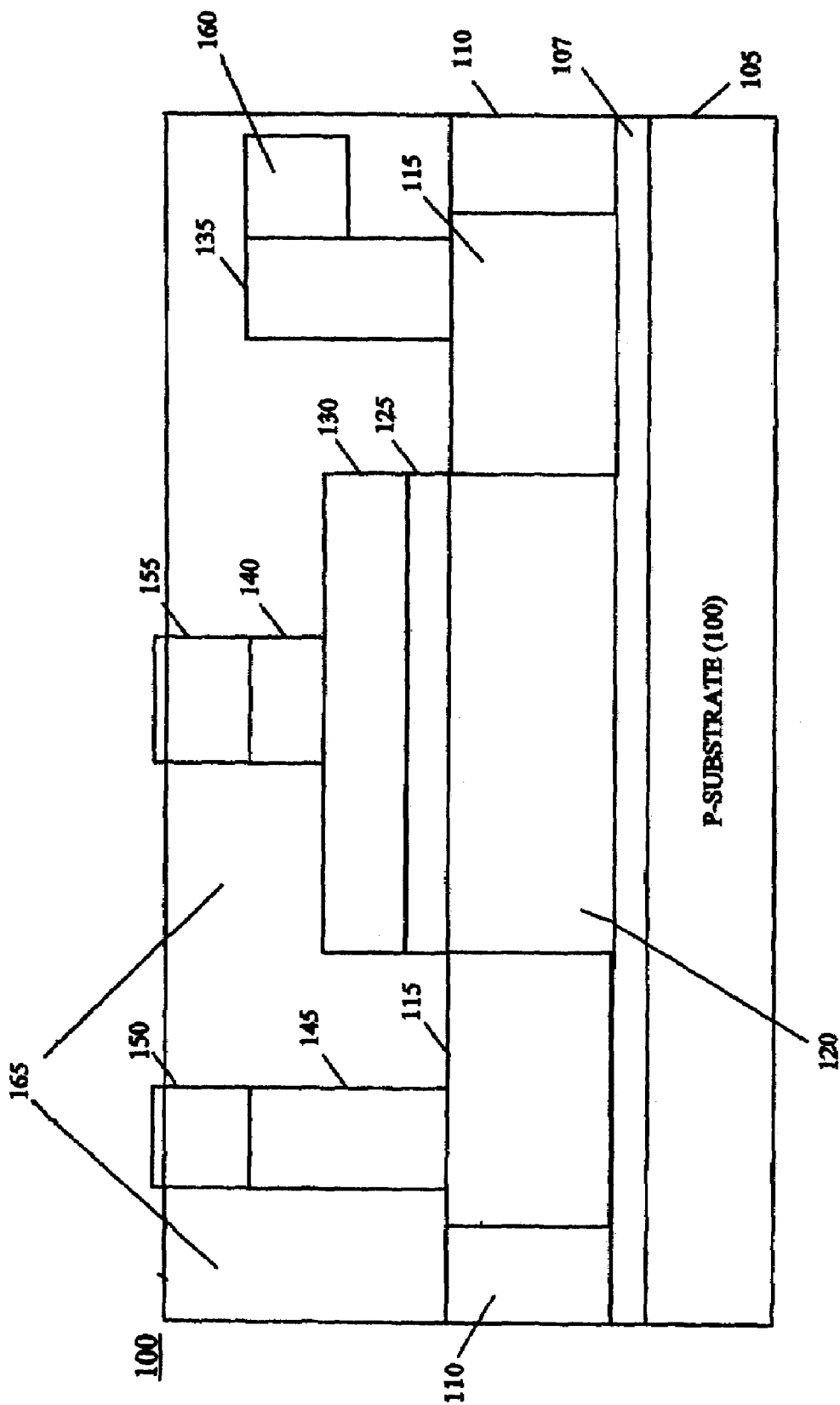
FIGS. 1 and 2 illustrate devices for forming an inverted multilayer semiconductor device in accordance with the invention.

Referring to FIG. 1, a first device 100 has silicon (Si) substrate 105 with a crystal orientation of [110] and a first $SiO_2$ layer 107 formed on top of the first Si substrate 105. A first Si layer 120 also having a crystal orientation of [110] is formed on the $SiO_2$ layer 107. Trenches are etched and filled with an insulating material such as an oxide to form shallow trench isolations 110 on either side of the active region of the first Si layer 120. Source/drain regions 115 are formed next to shallow trench isolations 110 in the first Si layer 120. The source/drain regions 115 are formed by any of the methods well known in the art for forming source/drain regions.

The upper surface of the first Si layer 120 is planarized after the source/drain regions 115 are formed using any of the methods well known in the art to planarize a Si layer. A second $SiO_2$ layer 125 is formed over a surface of the first Si layer 120. A polysilicon gate 130 is formed on top of the second $SiO_2$ layer 125 such that a portion of the second $SiO_2$ layer 125 forms a gate oxide for the first gate 130 of the first device 100.

A CA gate contact 140 is formed on the gate 130 and a metal (M1) contact 155 is formed on the gate contact 140. Source/drain CA contacts 135 and 145 are formed on the source/drains 115. Source/drain MI 160 and 150 and gate metal 155 are formed thereon, respectively.

A dielectric 165 is formed over the top of the first device 100, and the top of the dielectric 165 is planarized. Additionally, the dielectric 165 may be etched so that the gate metal 155 and the source/drain metal 150 are slightly higher than the surrounding dielectric 165 to facilitate making positive contact thereon during a later bonding process. Such an etching process may include etching the top surface of the dielectric 165 with an etchant which selectively removes dielectric material, but does not remove the material of the gate metal 155 and source/drain metals 150. Alternatively, the gate metal 155 and drain/source metal 150 may be protected by a mask while the top surface of the dielectric 165 is etched.

Another method to raise the gate metal 155 and source/drain metal 150 above the top surface of the dielectric 165 may include planarizing the dielectric 165, a gate metal 155 and source/drain metal 150, and building up the gate metal 155 and source/drain metal 150 to stand slightly above the top surface of the dielectric 165. Such a build-up process may include masking the surrounding dielectric 165 to leave the gate metal 155 and source/drain metal 150 exposed, and depositing or growing a suitable conductive material on the exposed gate metal 155 and source/drain metal 150.

Figure 2:
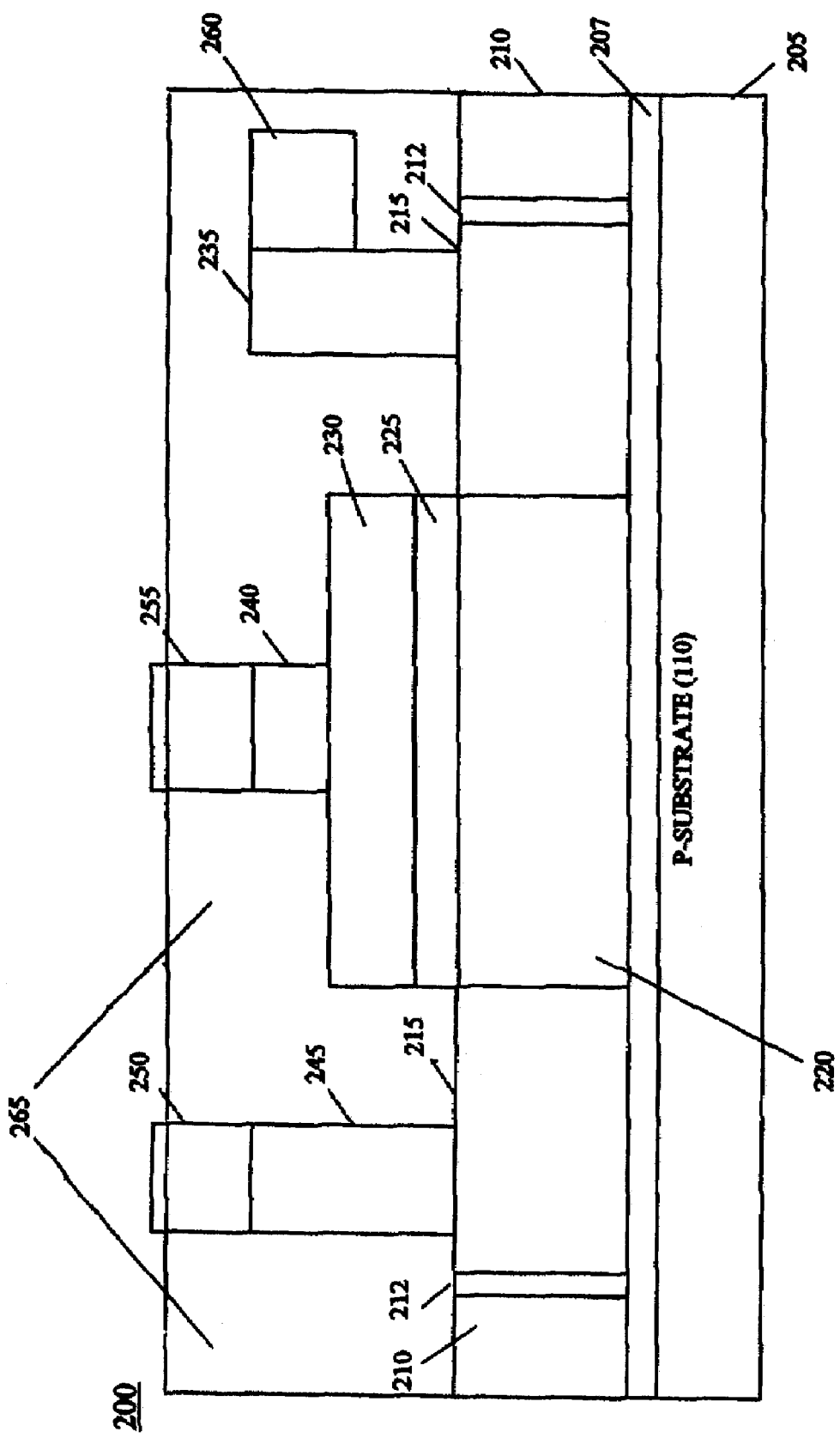

Referring to FIG. 2, a second device 200 is also formed using similar Fabrication methods appropriate for producing the second device 200. However, the second device 200 may have a crystal orientation in its active region different from the first device 100. This is possible due to the separate fabrication processes of each of the devices, prior to inverting the second device 200 bonding. Accordingly, a second Si substrate 205 having a crystal orientation of [100] has a second $SiO_2$ layer 207 formed thereon. The second $SiO_2$ layer 207 has a second Si layer 220 formed on top. The second Si layer 220 is formed to include an active region of the second device 200 and is arranged over the second Si layer 207.

Trenches are etched into the second Si layer 207 and filled with an insulator such as an oxide using any of the methods well known in the art for forming and filling a trench to create shallow trench isolations 210. Source/drain regions 215 are formed on each side of an active region 225. The source/drain regions 215 of the second device 200 are formed by any of the methods well known in the art for forming source/drain regions 215. A portion of the N-well 212 lies between the shallow trench isolation 210 and the source/drain regions 215.

After the source/drain regions 215 are formed in the second device 200, a gate oxide 225 is formed on top of the active region of the second Si layer 220. The gate oxide 225 may be formed by any of the techniques well known in the art for forming a gate oxide. After the gate oxide 225 is formed, a polysilicon gate 230 is formed over the gate oxide 225. A CA contact 240 is formed on the poly gate 230 and a metal (M1) 255 is formed on the CA contact 240. Source/drain M1 contacts 235 and 245 are formed on the source/drains 215. Source/drain metals 260 and 250 are formed thereon, respectively.

A dielectric 265 is formed over the top of the first device. As discussed with the first device, 100, the second device is formed so that the gate metal 255 and source/drain metal 250 protrude slightly above the dielectric 265 surface. For example, the top of the dielectric is planarized and then etched to leave the tops of the gate metal 255 and a source/drain metal 250 slightly protruding above the surrounding surface, depending on the connection.

Figure 3:
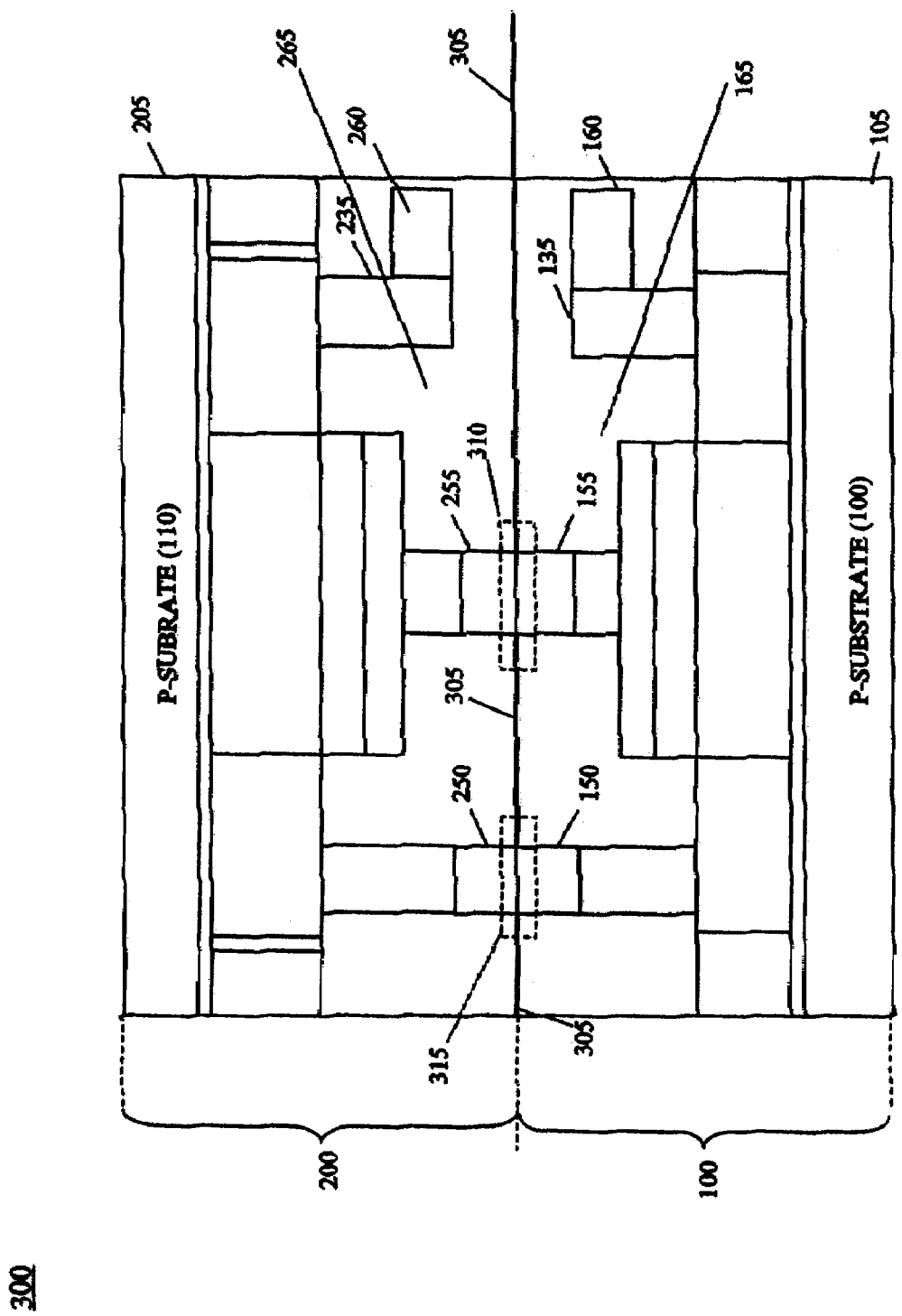
FIG. 3 illustrates an inverted multilayer semiconductor device in accordance with the invention.

Referring to FIG. 3, once the first device 100 and the second device 200 are formed, the second device 200 is inverted and bonded to the top of the first device 100 with a bonding layer 305. The bonding layer 305 attaches a top of the first device 100 to the top of the second device 200. The first and second devices, 100 and 200, are aligned with one another so that the first source/drain metal of each device 150 and 250 align with one another to make electrical contact there between. Also, the gate metal, 155 and 255, of each device is also aligned and put in electrical contact with one another. The first and second devices, 100 and 200, may be fabricated and bonded in virtually any appropriate manner to align virtually any metal contact of the first device 100 with a metal contact of the second device 200 as desired.

The bonding layer 305 bonds the second device 200 to the first device 100 using methods and materials well known in the art for bonding one device to another. The bonding layer 305 may include any insulating substance capable of bonding a first semiconductor device to a second semiconductor device, such as, for example, a nanocleave method. Other examples of bonding layers include contact adhesive and expoxies. Further examples of bonding layers include certain oxides used for bonding purposes well know in the art.

The bonding layer 305 should be applied so as not to interfere with the electrical connection or gate interconnect 310 between the two gate metals 155 and 255 and the electrical connection or source/drain interconnect 315 between the two source/drain metals 150 and 250. This may include applying the bonding layer 305 so it is clear of the gate metals 155 and 255 and the source/drain metals 150 and 250. Where appropriate, the bonding layer may also be applied in a viscous state so that it flows from the gate metal, 155 and 255, and source/drain metal, 150 and 250, surfaces when the surfaces make contact with one another.

As an alternative to a bonding layer, the first device 100 may be clamped to the second device 200 with an external clamping force. The external clamping force may obviate the need to use a bonding layer between the two devices (also represented as reference numeral 305).

After the first device 100 and the second device 200 are bonded to one another, metal plugs may be formed to the interconnections, 310 and 315, the first and second devices, 100 and 200. For example, the source/drain interconnection 315 may be connected to a metal plug. Similarly the source/drain of the lower device may be connected to a voltage source $V_{ss}$. The gate interconnection 310 may be connected to a metal plug to receive a voltage input $V_{in}$. The separate source/drain metals, 160 and 260 may be separately connected to respective wire or plugs.

In operation, the inverted multilayer device 300 of FIG. 3, where the first device 100 is a pFET and the second device 200 is an nFET, is configured to function as a CMOS inverter. The CMOS inverter is configured to occupy half the surface area on an IC chip due to its inverted multilayer structure. The first and second devices, 100 and 200, of the CMOS device 300 are internally connected to one another with a minimum number of metal wires due to the inverted position of the second device, thereby simplifying the input and output leads to the CMOS device 300. Additionally, because the second device 200 is inverted or flipped over, the respective substrates, 105 and 205, of each device are exposed thereby enhancing the heat dissipation from each device. Also, in this manner, since the first and second devices 100 and 200 are formed separately, and then combined, it is possible to obtain a stacked structure with an inverted layer or device having a different crystal orientation in its active region relative to the other layer or device.

In other words, FIG. 3 shows an embodiment of an inverted multilayer device in accordance with the invention, and may equally represent a fabrication process or an apparatus or device. The multilayer device 300 includes a first device 100, for example, a pFET, onto which a second device 200, for example, an nFET, is bonded in an inverted position. The first device 100 and the second device 200 each have a different crystal orientation from one another in the active region of the multilayer device 300. Thus, the method and apparatus includes forming an integrated circuit having two semiconductor layers bonded together, where a semiconductor layer is rotated 180 degrees with respect to the other semiconductor layer, and each semiconductor layer has a crystal orientation different from the other. Rotating and bonding the semiconductor layers improves the connectability and heat transfer properties of the final structure.

Other advantages of the inverted multilayer SOI device include a reduction of about 50% of the area needed to create a circuit and using different crystal orientations for different devices. Additionally, where inverted multilayer devices are symmetrical, photolithography masks may be shared.

While the invention has been described in terms of exemplary embodiments, those skilled in the art will recognize that the invention can be practiced with modifications and in the spirit and scope of the appended claims.

What is claimed is:

1. A semiconductor device assembly comprising:
a pFET device comprising a first substrate having a first crystal orientation;
an nFET device comprising a second substrate having a second crystal orientation different from the first crystal orientation,
wherein the nFET device is inverted on a surface of the pFET device such that a first dielectric layer of the pFET device is bonded to a second dielectric layer of the nFET device between the first substrate and the second substrate,
a first gate contact of a first gate of the pFET device is aligned with and in direct contact with a second gate contact of a second gate of the nFET device, and
a first metal source/drain contact of the pFET device is aligned with and in direct contact with a second metal source/drain contact of the nFET device.

2. The semiconductor device assembly of claim 1, wherein the first crystal orientation is [110] and the second crystal orientation is [100].

3. The semiconductor device assembly of claim 1, wherein the first substrate and the second substrate are exposed for enhancing heat dissipation.

4. The semiconductor device assembly of claim 1, wherein the first substrate and the second substrate are exposed.

5. The device of claim 1, wherein the pFET and nFET devices are separately formed.

6. A semiconductor device assembly, comprising:
a first device having a first crystal orientation;
a separately formed second device having a second crystal orientation different from the first crystal orientation inverted on a surface of the first device;
a source/drain metal of the first device being aligned with and in direct contact with a source/drain metal of the second device;
a gate metal of the first device being aligned with and in direct contact with a gate metal of the second device; and
a bonding layer bonding the first device to the second device, wherein the bonding layer is clear of the gate metal of the first device and the gate metal of the second device.

7. The device of claim 6, wherein the first device is a pFET and the second device is an nFET.

8. A semiconductor device assembly, comprising:
an NMOS device having a first crystal orientation; and
a PMOS device having a second crystal orientation different from the first crystal orientation inverted on a surface of the NMOS device,
wherein a first substrate of the NMOS device and a second substrate of the PMOS device are exposed for enhancing heat dissipation from each device,
the NMOS device comprises:
a first $SiO_2$ layer arranged on the first substrate, and
a first Si layer, first shallow trench isolation regions, and first source/drain regions formed on the first $SiO_2$ layer, and
the PMOS device comprises:
a second $SiO_2$ layer arranged on the second substrate,
a second Si layer, second shallow trench isolation regions, second source/drain regions, and N-wells formed on the second $SiO_2$ layer
a first gate contact of a first gate of the PMOS device is aligned with and in direct contact with a second gate contact of a second gate of the NMOS device, and
a first metal source/drain contact of the PMOS device is aligned with and in direct contact with a second metal source/drain contact of the NMOS device.

9. The semiconductor device of claim 8, further comprising a bonding layer bonding the PMOS device to the NMOS device, wherein the bonding layer is clear of the first gate contact of the PMOS device and the second gate contact of the NMOS device, and the bonding layer comprises insulating epoxy.

* * * * *